United States Patent [19]

Megumi et al.

[11] 4,187,109
[45] Feb. 5, 1980

[54] STRONTIUM BARIUM NIOBATE SINGLE CRYSTAL DOPED WITH CE

[75] Inventors: Koichi Megumi; Hirotsugu Kozuka, both of Tokyo; Masayoshi Kobayashi, Hachioji; Yoshio Furuhata, Kodaira, all of Japan

[73] Assignee: Hitachi, Ltd., Japan

[21] Appl. No.: 652,174

[22] Filed: Jan. 26, 1976

[30] Foreign Application Priority Data

Jan. 27, 1975 [JP] Japan .................................. 50-10500

[51] Int. Cl.² .......................... G03C 1/76; G03C 1/00
[52] U.S. Cl. ....................... 430/2; 252/62.9; 252/30 O; 346/134; 350/3.61
[58] Field of Search ................... 96/88, 90 PC, 67; 252/62.9, 30 O; 156/605, 606, DIG. 78, DIG. 71; 346/134; 350/3.5

[56] References Cited

U.S. PATENT DOCUMENTS

| | | | |
|---|---|---|---|
| 3,652,145 | 3/1972 | Thaxter | 350/3.5 |
| 3,933,504 | 1/1976 | Phillips et al. | 96/88 |
| 3,997,350 | 12/1976 | Ikeo et al. | 96/88 |

OTHER PUBLICATIONS

Liu et al., International Electron Device Meeting Technical Digest, pp. 259–262, 1974.
Aleksyuk, Resistance Anomaly in Semiconducting Barium Strontium Niobates, Chem. Abstracts, vol. 79, 11103t, (1973).
Cotton et al., Advanced Inorganic Chemistry, pp. 625–628, 1969.
Journal of Electronic Materials, vol. 2, No. 1, Feb. 1973, pp. 191–200.

Primary Examiner—Won H. Louie, Jr.
Attorney, Agent, or Firm—Craig and Antonelli

[57] ABSTRACT

An optical element is composed of a single crystal of strontium barium niobate doped with a transition metal element such as cerium, vanadium or uranium. This element has the property of undergoing very sensitively a change in its refractive index by the application of a beam of light of specific wavelength.

4 Claims, 5 Drawing Figures

STRONTIUM BARIUM NIOBATE SINGLE CRYSTAL DOPED WITH CE

BACKGROUND OF THE INVENTION

1. Field of the Invention

The present invention relates to an optical element composed of a ferroelectric single crystal capable of photo-induced refractive index changes and more particularly to an optical element composed of strontium barium niobate single crystal containing a dopant to increase the sensitivity to a beam of light.

2. Brief Description of the Prior Art

Although optical damage effects in response to a laser beam in a ferroelectric crystal is well known and very harmful in the case of an element for a light modulator, a second harmonics generator or a light deflector the effect suggests a new use of such optic crystals for an optical memory element. In general, an optically damaged crystal undergoes a local change in its refractive index at the irradiated portion of the crystal which can maintain the change for some time and has the capability for reverting to the original state by the irradiation of a beam of light of the same wavelength on the entire surface thereof. Optical information can be recorded in a crystalline body as refractive index changes and can be erased by making use of the above-mentioned phenomena. In other words, a reversible optical recording element can be obtained. Furthermore, high diffraction efficiency may be expected because the information can be recorded in the form of a phase-volume hologram by holographic recording technology.

In order to obtain a recording element of such high capabilities theoretical and experimental studies on the optical damage effects have been made and now it is understood that the optical damage effect is caused by the following mechanism.

There are, in crystals undergoing the optical damage effect filled traps caused by impurities, vacancies or the like. The filled traps easily generate free electrons in the conduction band when the electrons in the filled traps absorb energy from the light beam having a wavelength corresponding to the energy gap between the filled traps and the conduction band. Then, the generated free electrons diffuse out into the outer irradiated portion and are trapped by the empty traps caused by impurities, vacancies or the like. As a result, there is generated in the inner and outer irradiated portion a macroscopic space charge field which induces the refractive index changes in the crystal.

As conventional materials developed for optical storage materials having the capability for photo-induced refractive index changes $LiNbO_3$ doped with iron or a metal element of a rhodium group have been well known. Information can be written in and erased from them by argon laser irradiation, because each of them has an absorption band wavelength of about 4880 Å. Furthermore, non-destructive read out can be achieved in response to helium neon laser irradiation.

However, these conventional crystals have very low sensitivities during writing and erasing, and high power irradiation over a long period of time are necessary for performing the functions required in practical memory elements. It is well known that such difficulties have significantly hindered their practical use.

Attempts have been made to increase the writing and erasing sensitivities of strontium barium niobate single crystal by applying an electric field simultaneously with the irradiation. This method is disclosed by U.S. Pat. No. 3,652,145 and requires the application of an electric field for improving the sensitivity. Accordingly, this previous method has difficult problems such as dielectric breakdown and complication of the apparatus.

SUMMARY OF THE INVENTION

An object of the present invention is to provide an optical element which overcomes the above-mentioned difficulties in the prior art and has a high sensitivity with respect to photo-induced refractive index changes.

Another object of the present invention is to provide an optical element for carrying out optical recordings, optical operations or the like with greater capability and efficiency than the prior art element.

To achieve the above-mentioned objects, the optical element of the present invention is composed of a strontium barium niobate single crystal, which is represented by the formula $(Sr_xBa_{1-x}O)_{1-y} \cdot (Nb_2O_5)_y$ and doped with cerium, and which may contain unavoidable impurities, wherein the values of x and y are represented by coordinates in the hatched area shown in FIG. 1.

When the values of x and y are out of the above-mentioned ranges, the obtained crystal does not have a solid solution structure but has a eutectic structure and a single crystal cannot be obtained, whereby the obtained crystal cannot be employed for the purpose of the present invention. On the contrary, the materials have a solid solution structure and ferroelectric property to thereby be proper for the purpose of the present invention when the values of x and y are in the above-mentioned ranges.

As other dopants for strontium barium niobate, one can select at least one element selected from the group consisting of vanadium and uranium. However, the preferable dopant is cerium in view of the diffraction efficiencies and recording sensitivities of the doped material. Furthermore, there may be also used a dopant composed of at least one element selected from the group of transition metals.

The cerium content in strontium barium niobate can range from 20 ppm to 10,000 ppm, the vanadium content from 30 ppm to 5,000 ppm, and the uranium content from 20 ppm to 7,000 ppm based on the total number of the cations for the purpose of the present invention. The preferable cerium content ranges from 20 ppm to 2,000 ppm and the more preferable cerium content from 30 ppm to 2,000 ppm based on the total number of the cations. When the dopant contents are lower than those lower limit values (20, 30 and 20 ppm for Ce, V and U, respectively, the improvements in the recording sensitivities and/or the diffraction efficiencies are not sufficient. The recording sensitivities increase with increasing dopant content. However, the quality of the crystals deteriorates for an excess of dopant exceeding the above-mentioned upper limit values of 10,000, 5,000 and 7,000 ppm for Ce, V and U, respectively, to thereby become unsuitable for the purpose of the present invention in view of the quality of read-out information. The preferable and, more preferable, ranges of the cerium content are determined from the view-point of keeping a good quality of recorded information and the improvement of the recording sensitivity. A desirable quality of recorded information is observed in case of the above-mentioned preferable cerium content range, and the remarkable sensitizing effect and the desirable quality of recorded information are observed in case of the more preferable cerium content range mentioned above.

The shape and dimension of the optical element of the present invention are not restricted specifically, but the element used for a holographic apparatus or the like has a plate-like shape with the thickness of from about 0.2 mm to about 10 mm in general. The optical element of the present invention has many uses such as in a reversible optical memory apparatus, an optical operation apparatus, and an optical waveguide in solid state optical devices. When the thickness is less than 0.2 mm, the diffraction efficiency becomes too low. On the contrary, for a thickness over 10 mm, the optical density of the element is too high. Accordingly, both cases are unsuitable for the most part of the uses of the present element.

DETAILED DESCRIPTION OF THE INVENTION

Figure 1:
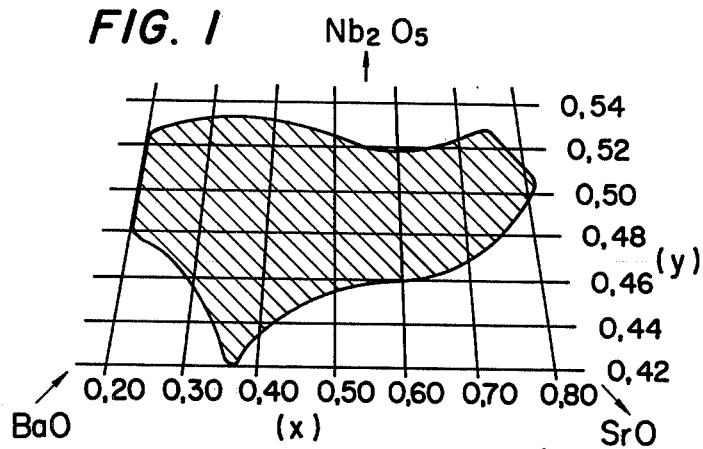
FIG. 1 is a ternary phase diagram illustrating the suitable values of x and y in the formula $(Sr_xBa_{1-x}O)_{1-y} \cdot (Nb_2O_5)_y$.

It is necessary for effectively increasing a change in refractive index, by which information can be recorded, to form the filled traps in the crystal which have the capability of generating free electrons effectively in response to a beam irradiation. The filled traps can be formed by adding a suitable amount of a suitable additive or dopant to the mother crystal.

A crystal doped with a suitable additive has the capability of recording information in response to low optical energy, because of an increase of the recording sensitivity caused by a high quantum efficiency in generating photo-electrons. On the contrary in the case of an unsuitable additive, very high energy is required for recording the same information as aforementioned and such an element is improper for practical uses. The recording property of the optical element according to the present invention is improved by employing strontium barium niobate as the motor crystal and by employing the aforementioned element, especially cerium as the dopant.

The strontium barium niobate single crystal used for the optical element of the present invention has an absorption band characterized by the dopant element because the crystal is doped with at least one element selected from the transition metals.

This doped strontium barium niobate single crystal has a very good writing and erasing sensitivity because of the increase in the light absorption coefficient and the resulting great optical damage effect caused by doping.

Furthermore, polarization reversal at room temperature can occur in the strontium barium niobate single crystal without difficulty because its Curie temperature Tc is close to room temperature (for example, Tc is about 50° C. in the crystal whose x and y are 0.7 and 0.50 respectively). In addition, the crystal has a ferroelectric fine domain structure. Therefore, it has also another advantage in its capabilities of fixing and instantly erasing informations by applying external electric fields.

Still another advantage of strontium barium niobate will be explained as follows. The strontium barium niobate crystal has a great number of unfilled sites. The crystal has a tungsten bronze type structure represented by the structural formula $A1_{(2)} A2_{(4)} C_{(4)} B_{(10)} O_{(30)}$, where A1, A2, C and B are the lattice sites at which cations can be situated. Ba and Sr can occupy the A1 or A2 sites, and Nb occupies the B site. The site occupancy rates of them are 83% in the A1 and A2 sites, 0% in the C site and 100% in the B site. Thus, the structure of this crystal has rather many unfilled sites. Accordingly, there are no difficulties in doping with transition metals or the like, and a good single crystal without optical defect such as striations and cores may be produced. In this connection, the distribution coefficient of cerium, copper and nickel are 0.8, 0.5 and 0.6, respectively.

The doped strontium barium niobate single crystal can be produced by the well-known Czochralski method, Kyropoulos method or flux method, wherein the dopant is added to the melt. Furthermore, it can be produced also by the method comprising the step of thermal diffusion of the dopant evaporated or coated on the surface of the single crystal produced by the above-mentioned well-known method. In this diffusion step, the dopant is introduced into the interior of the single crystal.

When cerium is used as the dopant, information can be written or erased by argon laser irradiation. Vanadium, manganese, cobalt, copper, ruthenium, iridium and uranium are the dopants having an effect like cerium and argon laser irradiation may be also used in the case of the optical element which contains these metal elements as dopants. Writing and erasing are possible by employing an irradiation light beam having a wavelength corresponding to the absorption band proper to each dopant element, in case of the other transition metals. For example, the chromium doped crystal has an absorption band of about 6328 Å, and is usable for a reversible optical memory element by employing helium neon laser irradiation. It is possible to erase recorded information electrically instantaneously by polarization reversal.

The reason why the single crystal of the present invention has the property of recording is that such a single crystal has an absorption band proper to the added dopant, namely a transition metal element, and the local changes of the refractive index occur by irradiating with a light beam having a wavelength corresponding to the absorption band. However, it is not always necessary that the dopant contains only one element. When the added dopants have wavelengths which are comparatively close to each other, there is no peculiar harmful influence on the doping by the simultaneous addition of the several elements. In some cases, this simultaneous addition of the dopants may have such a good effect that the selection of the writing and erasing light wavelength can be arbitrary. When the added dopants have clearly different absorption band wavelengths, strontium barium niobate with several dopants has two states different in the absorption spectrum by employing light beams of suitable wavelengths as the irradiation source. Such a combination of photochromics and optical damage effect makes it possible to realize a reversible optical recording apparatus which has a capability for nondestructive read-out by the irradiation of the same wavelength light as writing, or a capability for writing, reading and erasing by the light beams of relatively different wavelengths.

Doped strontium barium niobate composing the optical element of the present invention may contain unavoidable impurities other than the transition metal elements.

One embodiment of the invention relates to optical elements having the optical damage effect, composed of cerium doped strontium barium niobate single crystals which were produced according to the following procedure.

The raw material powders composed of strontium carbonate, barium carbonate and niobium pentoxide of high impurities were prepared in such amounts to yield a chemical composition of $(Sr_xBa_{1-x}O)_{1-y}(Nb_2O_5)_y$ in which the values of x and y were 0.75 and 0.5 respectively; they were then mixed by a mixing machine in dry air for about five hours. The mixed powder was formed by pressing, and was sintered at 1400° C. for two hours. The sintered sample of $Sr_{0.75}Ba_{0.25}Nb_2O_6$ thus obtained was packed in a platinum crucible, as a charge for growing a single crystal, and cerium oxide was added at this step. The amount of the added cerium was 30 ppm, 440 ppm or 1,000 ppm based on the total number of cations. Then, the mixture was melted and a single crystal was grown by the Czochralski method in which the crystal rotating velocity and the crystal pulling-up speed were from 30 to 60 rpm and from 5 to 10 mm/hr respectively, and the melt was heated by the ordinary radio heating. Furthermore, it was found that the rotating velocity could range from 10 to 120 rpm and any values up to 20 mm/hr could be taken as the pulling up speed. After growing, the grown crystal was cooled slowly in order to remove the color caused by oxygen vacancies. Then the crystal was shaped into a plate having a thickness of about 5 mm.

Figure 5:
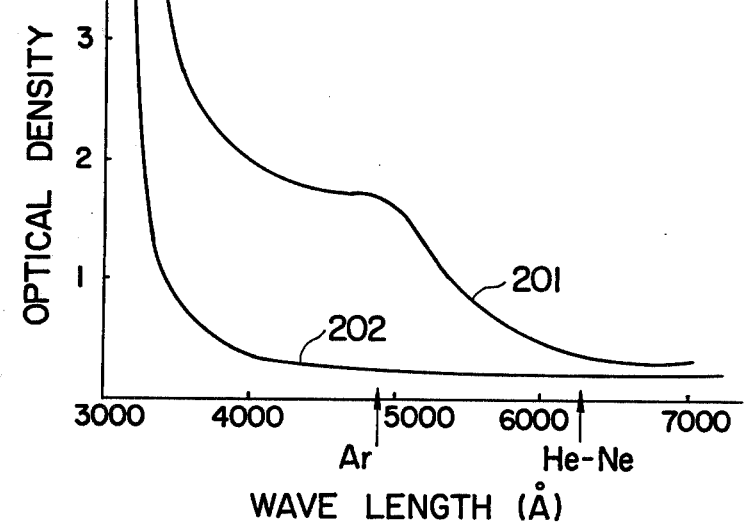
FIG. 5 is a diagram illustrating the relation between optical density, namely the product of the absorption coefficient by the thickness of the element and wavelength in cerium doped strontium barium niobate.

As mentioned above, the cerium doped strontium barium niobate single crystal has an absorption band of about 4,880 Å which is attributed to the cerium element, and it is possible to write and erase information using an argon laser beam having a wavelength of 4,880 Å. FIG. 5 illustrates absorption spectrums of the 440 ppm cerium doped strontium barium niobate single crystal and non-cerium doped crystal. Curve 201 represents the former and curve 202 the latter. It is seen from FIG. 5 that the absorption band, which is attributed to the cerium element, exists in the shorter wavelength side than about 4,880 Å, and that it is possible to write and erase information with a high efficiency by using an argon laser beam of 4,800 Å wavelength.

The optical recording properties of the optical element composed of the 440 ppm cerium doped strontium barium niobate single crystal were as follows. The light energy required to obtain a diffraction efficiency of 1% was about 10 mJ/cm$^2$ and that required to erase the recorded information to remove three-quarters of the recorded intensity, namely required for so-called erasure ($\frac{3}{4}$) was about 50 mJ/cm$^2$. These values of the light energies were less than one-tenth of the light energies required in the iron or rhodium group metal element doped LiNbO$_3$ single crystal heretofore in use. Furthermore, the strontium barium niobate single crystal without a dopant requires light energy on the order of J/cm$^2$ which is much larger than the value in the present invention. A weak argon laser beam or a helium neon laser beam, which has a wavelength of 6,328 Å can be used for reading out information according to the present invention. In case of using the latter laser beam, the recorded information retained their initial states for a very long time. The maximum diffraction efficiency could reach up to about 80% which was over five times as high as that of the optical element composed of the strontium barium niobate single crystal having no dopant.

The writing and erasing energies were 50 mJ/cm$^2$ (for a diffraction efficiency of 1%) and 230 mJ/cm$^2$ (for erasure ($\frac{3}{4}$)), respectively, in the case of a dopant of 30 ppm cerium, and 3 mJ/cm$^2$ and 24 mJ/cm$^2$, respectively, in the case of a dopant of 1000 ppm cerium.

A great amount of cerium can be markedly held in solid-solution in the strontium barium niobate, and can be easily added without making the mother crystal quality poor, to the extent of about 2,000 ppm. Even when the content of cerium reaches an extent of about 10,000 ppm, the mother crystal quality deteriorates only slightly. In the case of such a great amount of dopant, it is necessary to thin the crystal because of an increase in its optical density, but the sensitivity and the resolution may be improved. In such a case of a thin crystal, the diffraction efficiency of some optical elements may decrease a little.

Optical devices comprising the above-mentioned optical elements will be explained hereunder.

Figure 2:
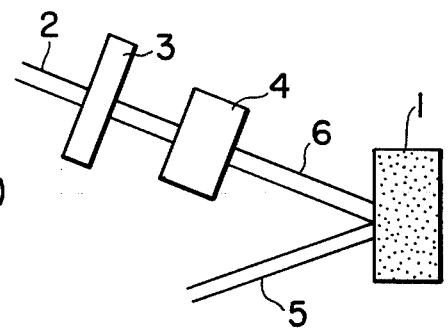
FIG. 2 is a schematic illustration of an optical memory apparatus employing the optical element of the present invention.

FIG. 2 illustrates an optical recording device in which an optical element of the present invention was used for recording information by the optical damage effect. An optical element 1 had the shape of a rectangular parallelepiped and was made of the cerium doped strontium barium niobate single crystal described above. The element 1 was used as a pair for recording. The argon laser beam 2 was modulated by the spatial modulator 3, such as a slide, then passed through the optical transform system 4 such as a Fourier-transform system, and then reached the optical element 1, namely the part for recording, as a data beam 6. Simultaneously, the recording portion of the element 1 was irradiated by the reference beam 5 which crossed the data beam 6 at the irradiated portion. The reference beam 5 was prepared by dividing the argon laser beam 2 by a beam-splitter or the like.

As a result, an interference fringe was formed by the data beam 6 and the reference beam 5, and corresponding refractive index changes occured in the single crystal, which composes the element 1.

Accordingly, information was recorded in the element as a phase recording. In order to erase the recorded information, the recording portion of the element 1 may be irradiated with only the reference beam 5 or polarization reversal may be made to occur in the optical element 1 by applying an external inverse electric field.

Figure 3:
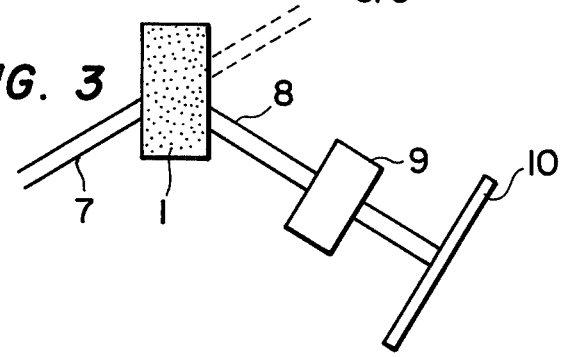
FIG. 3 is a schematic illustration of an optical reading apparatus employing the optical element of the present invention.

FIG. 3 shows a schematic illustration of an optical apparatus for reading out information in the recording portion of the optical element 1 according to the present invention. The same date beam 8 as the above-mentioned data beam 6 irradiated as a diffractive beam when the single crystal portion, at which the information had been recorded of the element 1, was irradiated with a laser beam other than an argon laser beam used for recording, for example a helium neon laser beam, at an angle satisfying the Bragg condition. The data beam 8 passed through an optical transform system 9 having a function which was inverse to the above-mentioned system 4. Then the beam reached the sense-array 10 and the same information as that recorded was reproduced.

Figure 4:
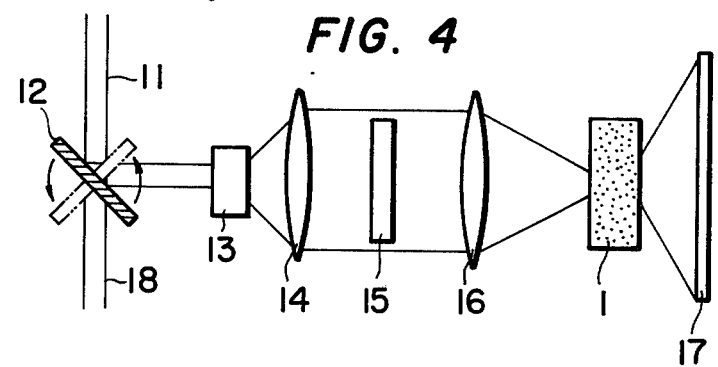
FIG. 4 is a schematic illustration of an image inspection apparatus having the optical element of the present invention.

The optical element of the present invention may be applied to an image inspection apparatus, which is shown by FIG. 4, as an example. The optical element 1 was made of the cerium doped strontium barium niobate single crystal which composed the portion in which the standard image was recorded and optical operations were performed, and it was the same as the afore-mentioned optical elements 1 illustrated in FIGS. 2 and 3. The argon laser beam 11 passed through a double-sided mirror 12, a beam-expander 13, and lens systems 14 and 16, then it was condensed at the element 1. Between the lens systems 14 and 16, there was provided an image supply apparatus 15, which held a standard image and images for examination and had the capability of changing the image provided at the optical path by rotating a circular plate which carried the images on a concentric circle circumference. The beam 11 was modulated by the standard image held by the image supply apparatus 15. Therefore, a Fourier-transform image of the standard image was formed and recorded at a portion, at which the beam was condensed, of the element 1. After that, a helium neon laser beam 18, which may be replaced by a laser beam other than an argon laser beam, was directed along the same path as the argon laser beam 11 by double-sided mirror 12 having a rotation mechanism. Simultaneously, the standard image was replaced by an image for examination held by the apparatus 15. Thus, a new Fourier transform image of the image for examination was formed at the portion of the element 1, at which an optical operation was performed by overlapping the Fourier transform image with the already-recorded Fourier transform image of the standard image. As a result, a correlated image appeared on the detector plane 17. When the image for examination was the same as the standard image, there appeared on the detector plane 17 a bright spot like the beam source. When both were different, no spot appears. To erase the recorded image, the single crystal of the element 1 might be irradiated by an argon laser beam, without images between the lens systems 14 and 16.

As is seen from the foregoing explanation, in accordance with the present invention, there can be obtained optical elements having excellent properties for providing good reversible optical recording apparatus, optical operation apparatus or the like, employing the optically induced refractive index changes caused by the optical damage effect.

What is claimed is:

1. An optical element composed of a single crystal consisting essentially of strontium barium niobate, which is represented by the formula $(Sr_xBa_{1-x}O)_{1-y} \cdot (Nb_2O_5)_y$ and doped with from 20 to 10,000 ppm of cerium based on the total number of cations of said niobate wherein the values of x and y are represented by coordinate in the hatched area in FIG. 1.

2. The optical element of claim 1, in which the amount of said cerium ranges from 20 to 2,000 ppm based on the total number of cations of said niobate.

3. The optical element of claim 1, in which the amount of said cerium ranges from 30 to 2,000 ppm based on the total number of cations of said niobate.

4. The optical element of claim 1, which has a high optical recording sensitivity and has a platelike shape of 0.2 to 10 mm thickness.

* * * * *